US011419240B2

(12) United States Patent
Guo et al.

(10) Patent No.: US 11,419,240 B2
(45) Date of Patent: Aug. 16, 2022

(54) WIRELESS CHARGER AND ELECTRONIC APPARATUS SET

(71) Applicant: BEIJING XIAOMI MOBILE SOFTWARE CO., LTD., Beijing (CN)

(72) Inventors: Jianguang Guo, Beijing (CN); Jiangang Bi, Beijing (CN); Fenghui Wu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 84 days.

(21) Appl. No.: 17/016,208

(22) Filed: Sep. 9, 2020

(65) Prior Publication Data
US 2021/0337701 A1     Oct. 28, 2021

(30) Foreign Application Priority Data

Apr. 24, 2020   (CN) .......................... 202010333066.8

(51) Int. Cl.
*H01M 10/46* (2006.01)
*H05K 7/20* (2006.01)
*H02J 50/10* (2016.01)
*H02J 50/00* (2016.01)
*H02J 7/00* (2006.01)

(52) U.S. Cl.
CPC ........ *H05K 7/20145* (2013.01); *H02J 7/0044* (2013.01); *H02J 50/005* (2020.01); *H02J 50/10* (2016.02); *H05K 7/20172* (2013.01)

(58) Field of Classification Search
CPC .... H02J 7/0044; H02J 7/0042; H02J 7/00309; H02J 50/10; H02J 50/005; H05K 7/20172; H05K 7/20145

USPC ................. 320/107, 108, 114, 115, 150, 153
See application file for complete search history.

(56) References Cited

FOREIGN PATENT DOCUMENTS

| CN | 104578233 | A | * | 4/2015 | ............ H02J 7/0042 |
| CN | 109729689 | A | * | 5/2019 | ............ H02J 50/005 |
| CN | 110165788 | A | * | 8/2019 | ............ H02J 50/005 |
| CN | 110994806 | A |   | 4/2020 | |
| EP | 3471237   | A1 |  | 4/2019 | |

OTHER PUBLICATIONS

Extended European Search Report in Application No. 20200986.6, dated Feb. 10, 2021.

* cited by examiner

*Primary Examiner* — Edward Tso
(74) *Attorney, Agent, or Firm* — Syncoda LLC; Feng Ma

(57) ABSTRACT

A wireless charger configured to charge a device includes: a charging base disposed at a lower portion of the vertical wireless charger; a support portion disposed over the charging base and configured to support the device being charged; a charging coil disposed in the support portion and configured to charge the device being charged; and a cross-flow fan disposed over the charging base, having a fan air outlet extending in a width direction of the support portion, and configured to dissipate heat away from the device being charged and/or the wireless charger through exhaust air. As such, a size of the vertical wireless charger in a length direction can be reduced, and the wind propagates in a straight line and covers a larger size of the wireless charger in the width direction, thereby improving heat dissipation and increasing wind propagation distance.

19 Claims, 12 Drawing Sheets

WIRELESS CHARGER AND ELECTRONIC APPARATUS SET

CROSS-REFERENCE TO RELATED APPLICATION

This application claims priority to Chinese Patent Application No. 202010333066.8 filed on Apr. 24, 2020, the disclosure of which is hereby incorporated by reference in its entirety.

BACKGROUND

With the development of technologies, terminal devices such as mobile phones can be charged by wireless charger, for example by placing them on the wireless charger. During the charging process, the devices being charged may continuously generate heat, which may result in a reduced battery life or even damage of the devices being charged. Therefore, a wireless charger is often provided with a centrifugal fan to dissipate heat.

SUMMARY

The present disclosure generally relates to the field of terminal device charging, and more specifically to a wireless charger.

Various embodiments of the present disclosure provide a wireless charger configured to charge a device, and the wireless charger includes: a charging base disposed at a lower portion of the vertical wireless charger; a support portion disposed over the charging base and configured to support the device being charged; a charging coil disposed in the support portion and configured to charge the device; and a cross-flow fan located over the charging base, having a fan air outlet extending along a width direction of the support portion, and configured to dissipate heat away from the device being charged and/or the wireless charger through exhaust air.

In some embodiments, the cross-flow fan includes: a fan housing having a cylindrical shape, and disposed to extend along the width direction of the support portion; a fan air inlet opened on an axial end face on one side or both sides of the fan housing; and the fan air outlet disposed in a radial direction of the fan housing and extending along an axial direction.

In some embodiments, the support portion is disposed over the charging base in an inclined and upwardly extending manner.

In some embodiments, the support portion includes: a casing in which the charging coil and the cross-flow fan are disposed and the cross-flow fan being disposed under the charging coil; and wherein a first surface of the casing is used to support the device being charged; and a casing air outlet is disposed on the first surface and extending along the width direction of the support portion, and the fan air outlet of the cross-flow fan being adjacent to an inner side of the casing air outlet.

In some embodiments, a side portion and/or a rear portion of the casing are provided with a casing air inlet.

In some embodiments, the first surface includes: a support surface located at a lower portion of the first surface, and used to support a lower portion of the device being charged; a charging surface located at an upper portion of the first surface, the charging coil being located at a rear side of the charging surface; and a stepped surface extending along the width direction of the support portion, the support surface and the charging surface being connected through the stepped surface, and there exists a gap between the device being charged and the charging surface, when the device being charged is supported on the support surface; and wherein the casing air outlet is disposed on the stepped surface.

In some embodiments, the stepped surface includes: a middle section, a first side section and a second side section; the middle section is located at a middle portion of the stepped surface, and extends along the width direction of the support portion; and the first side section and the second side section are coupled to both ends of the middle section respectively, extend toward an upper portion of the support portion, and connect to side surfaces of the casing.

In some embodiments, the casing air outlet is disposed in the middle section.

In some embodiments, the charging coil is disposed inside the casing movably.

In some embodiments, the wireless charger further includes: a drive component disposed inside the casing, coupled to the charging coil, and used to drive the charging coil to move along a length direction of the support portion inside the casing.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this disclosure, illustrate embodiments consistent with the present invention and, together with the description, serve to explain the principles of the present invention.

DETAILED DESCRIPTION

Description will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present invention. Instead, they are merely examples of apparatuses and methods consistent with aspects related to the present invention as recited in the appended claims.

It should be noted that although the expressions such as "first," "second" etc. are used herein to describe different modules, steps and data of the implementations of the present disclosure, the expressions such as "first," "second" etc. are only used to distinguish different modules, steps and data, and do not indicate a specific order or importance. In fact, the expressions such as "first," "second" etc. can be used interchangeably.

A centrifugal fan can be thin and easy to install in a wireless charger.

However, a wind direction of the centrifugal fan may have a certain arc, which leads to a reduction in the linear propagation distance of the air volume and poor heat dissipation effect.

Figure 1:
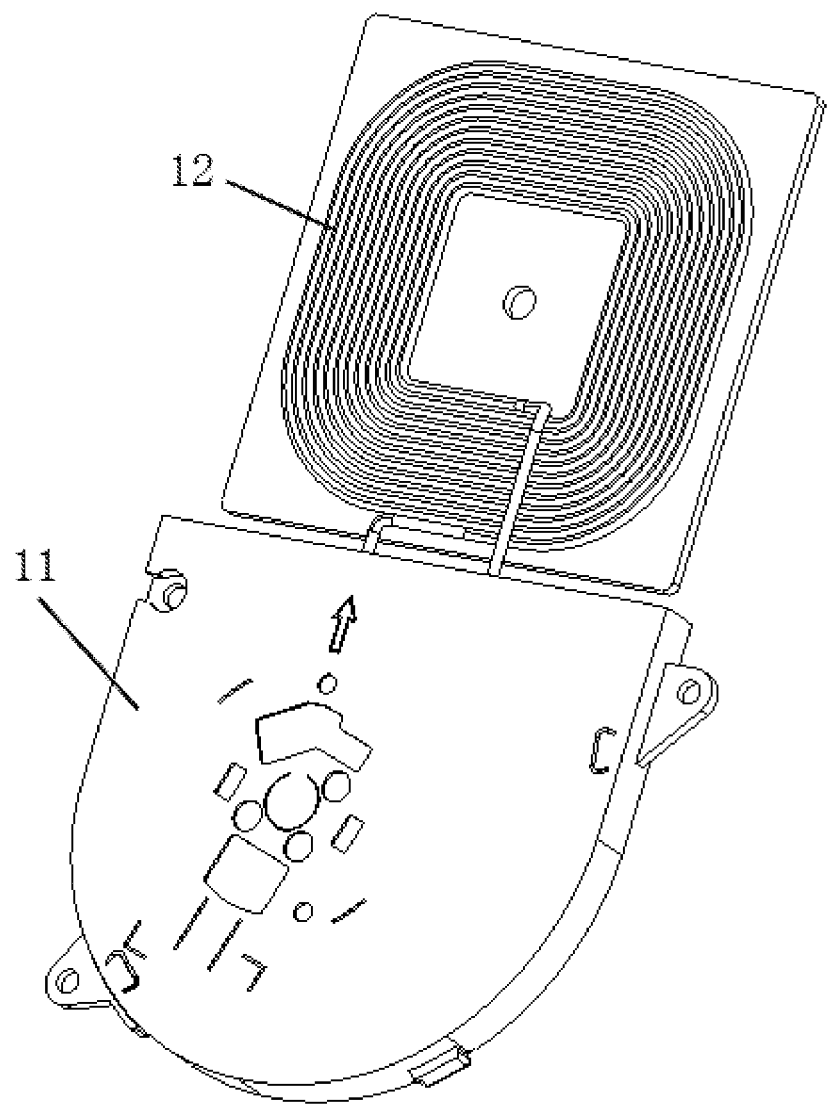
FIG. 1 is a schematic diagram of a wireless charger according to some embodiments.

As shown in FIG. 1, a wireless charger 10 can have a charging coil 12 for charging a device, and a centrifugal fan 11, which has a thinner thickness and a longer size in a length direction, is used for heat dissipation.

Figure 2:
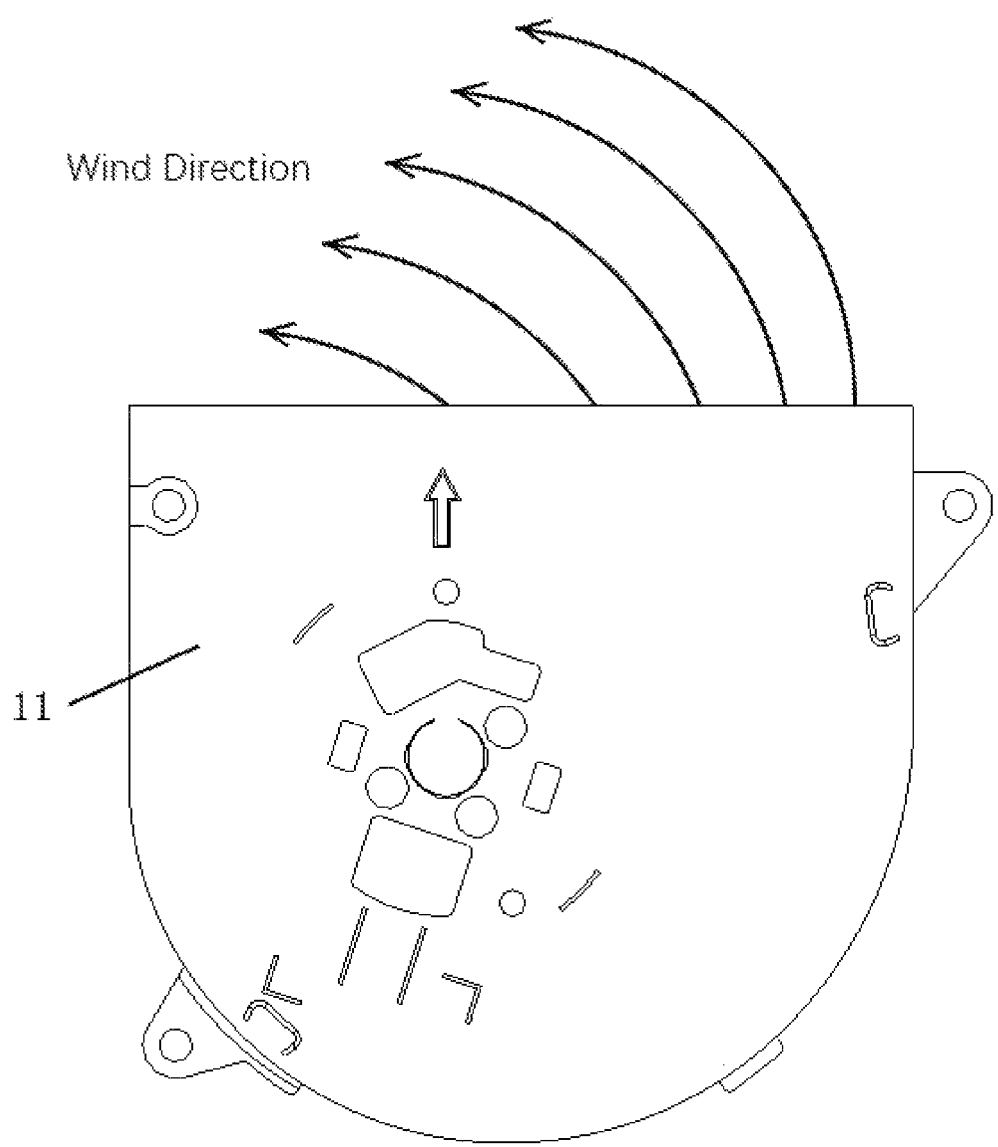
FIG. 2 is a schematic diagram of a wind direction of a centrifugal fan of the wireless charger according to some embodiments.

As shown in FIG. 2, the wind blown out from the centrifugal fan 11 has an arc and is skewed, which cannot achieve a good heat dissipation effect, and especially in some cases, when the centrifugal fan 11 is far away from the charging coil 12, the heat dissipation effect is worse, resulting in potential damages to the wireless charger 10 itself or the device being charged.

Figure 3:
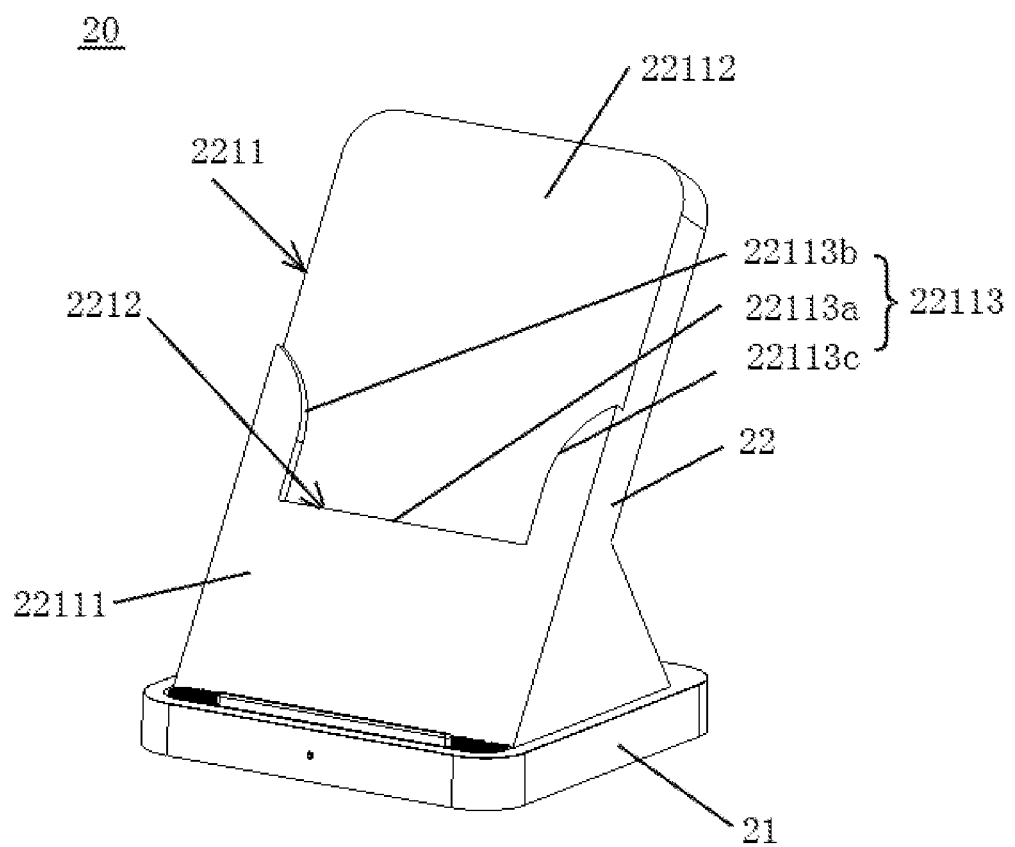
FIG. 3 shows a three-dimensional schematic diagram of a wireless charger according to some embodiments of the present disclosure.

Various embodiments of the present disclosure provide a wireless charger 20, a three-dimensional schematic diagram of which is illustrated in FIG. 3.

Figure 4:
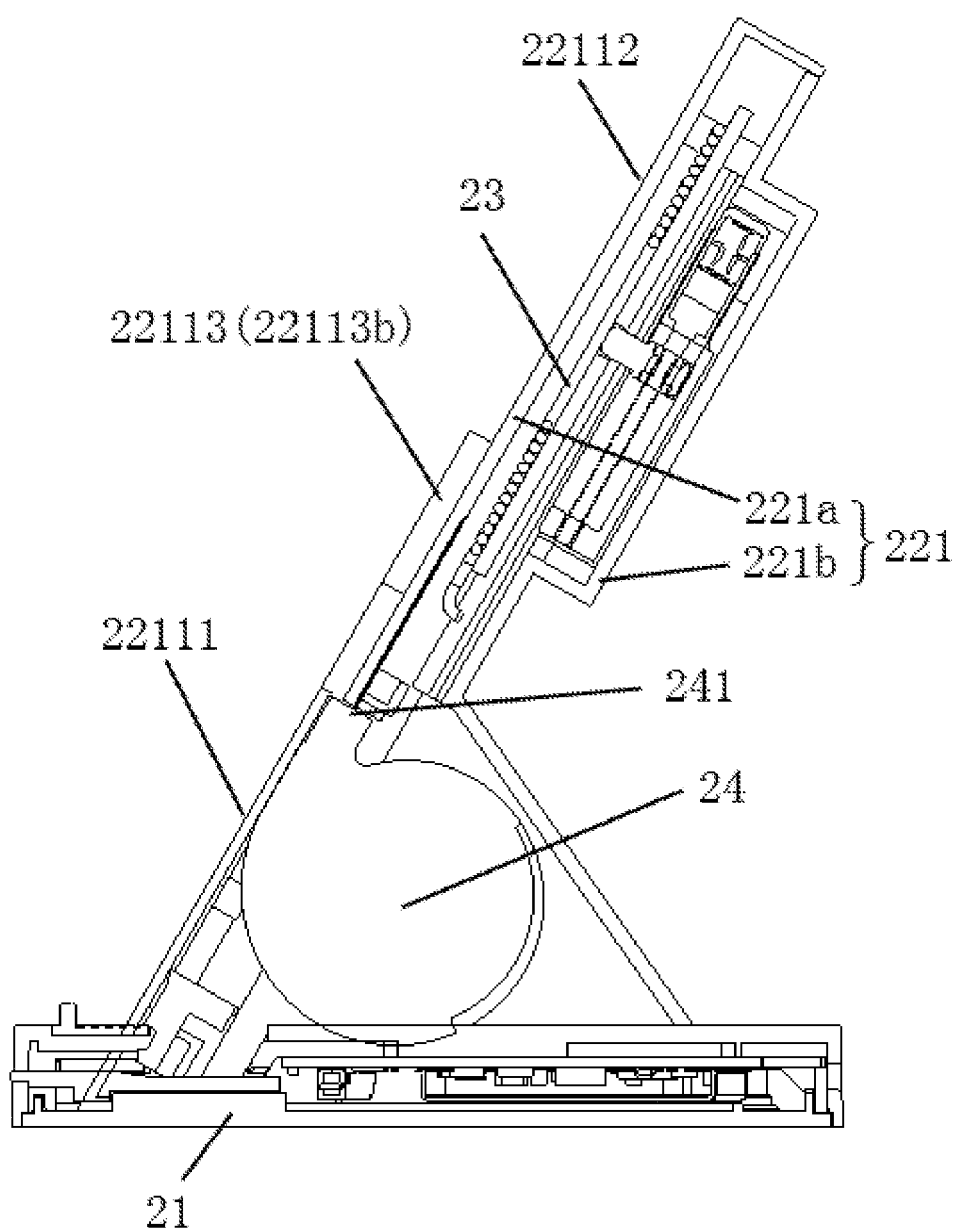
FIG. 4 shows a side cross-section schematic diagram of the wireless charger according to some embodiments of the present disclosure.

FIG. 4 shows a side cross-section schematic diagram of the wireless charger 20 according to some embodiments of the present disclosure.

Figure 5:
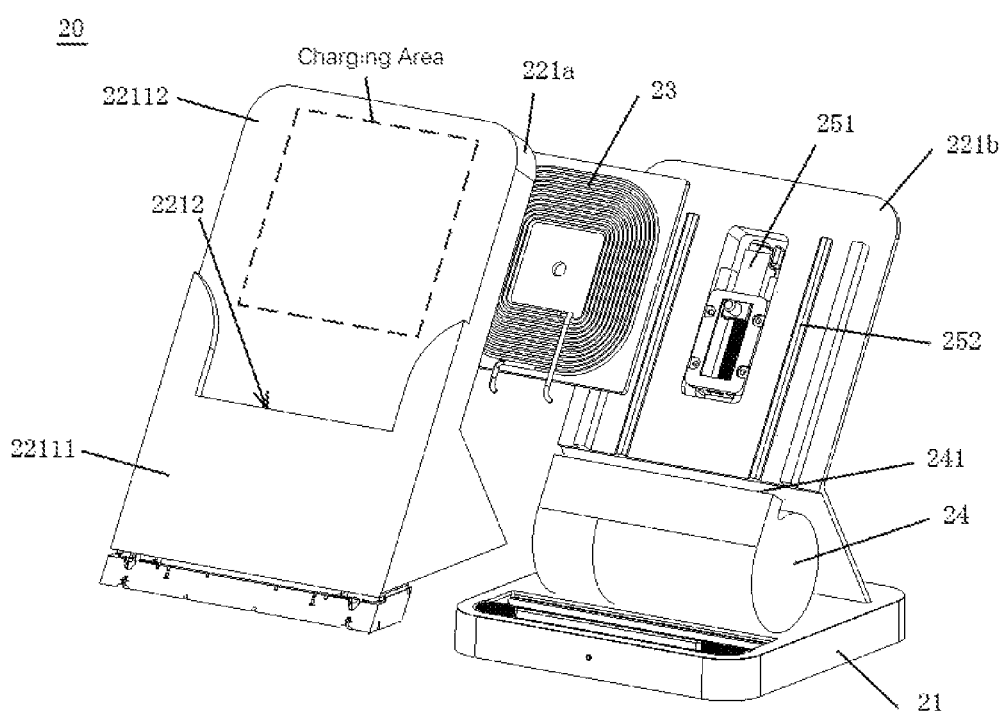
FIG. 5 shows a three-dimensional exploded schematic diagram of the wireless charger according to some embodiments of the present disclosure.

FIG. 5 shows a three-dimensional exploded schematic diagram of the wireless charger 20 according to some embodiments of the present disclosure.

Figure 6:
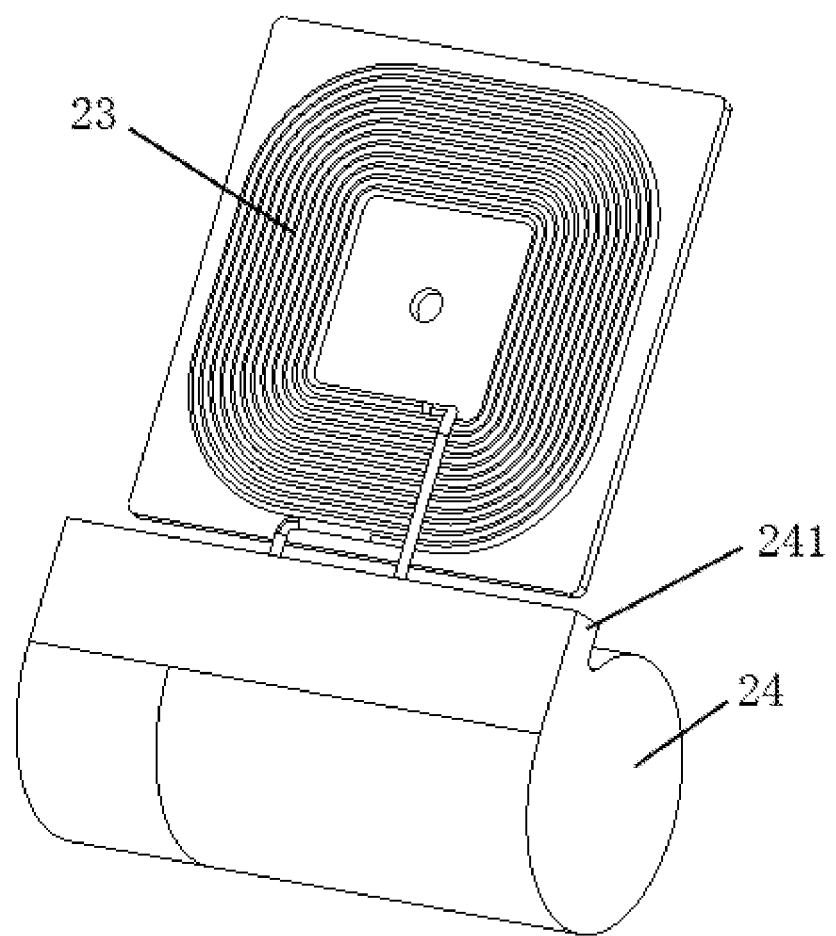
FIG. 6 shows a partial schematic diagram of the wireless charger according to some embodiments of the present disclosure.

FIG. 6 shows a partial schematic diagram of the wireless charger 20 according to some embodiments of the present disclosure.

Figure 7:
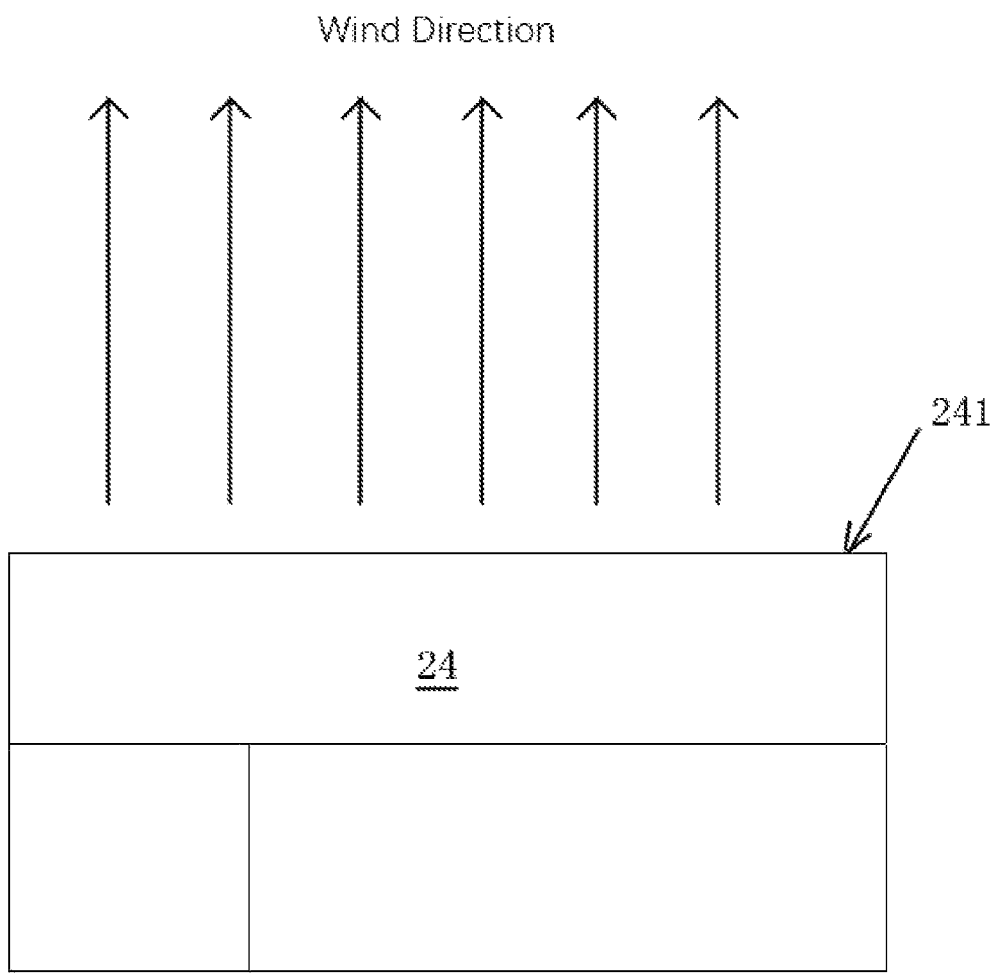
FIG. 7 shows a schematic diagram of the wind direction of a cross-flow fan of the wireless charger according to some embodiments of the present disclosure.

FIG. 7 shows a schematic diagram of the wind direction of a cross-flow fan 24 of the wireless charger 20 according to some embodiments of the present disclosure.

Figure 8:
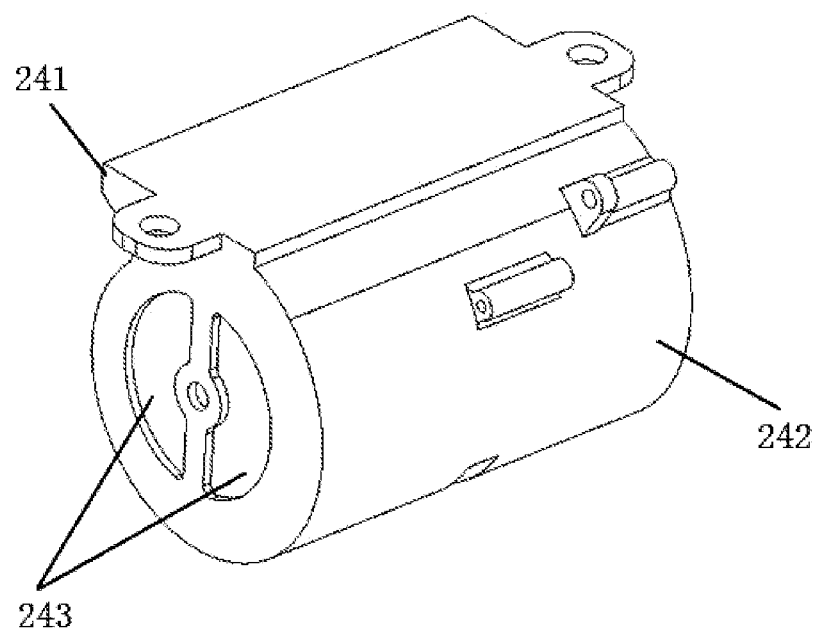
FIG. 8 is a three-dimensional schematic diagram of the cross-flow fan at a first angle.
Figure 9:
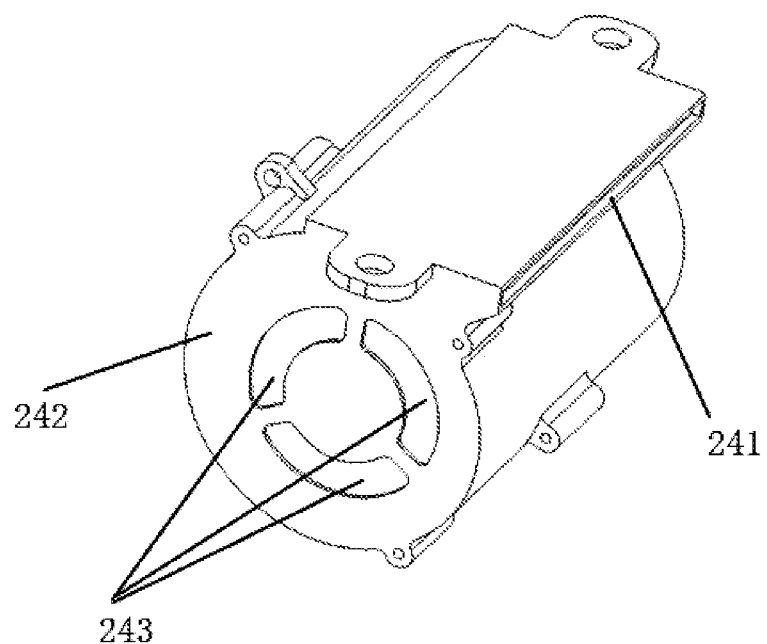
FIG. 9 is a three-dimensional schematic diagram of the cross-flow fan at a second angle.
Figure 10:
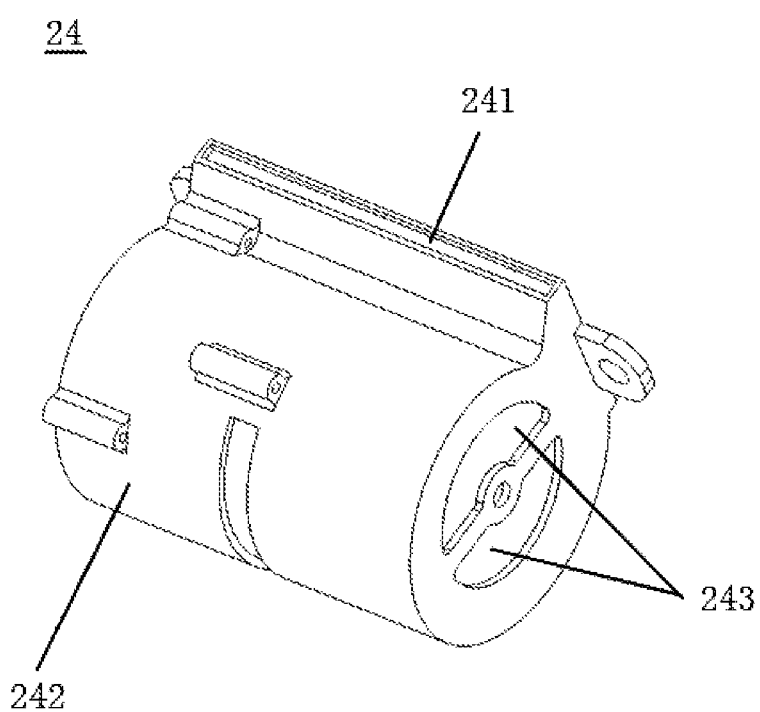
FIG. 10 is a three-dimensional schematic diagram of the cross-flow fan at a third angle.

FIG. 8 to FIG. 10 show three-dimensional schematic diagrams of the cross-flow fan 24 at different angles.

The wireless charger 20 can be used to charge a device being charged, herein, the device being charged can be a terminal device such as a mobile phone etc., and the wireless charger can be a vertical type or a tablet type. The wireless charger 20 can include: a charging base 21, a support portion 22, a charging coil 23 and the cross-flow fan 24.

Herein, the charging base 21 is disposed at a lower part of the wireless charger 20, and the charging base 21 can be provided with circuit components such as a power supply etc. of the charger, and can support the support portion 22.

The support portion 22 is disposed above the charging base 21, and is used to support the device being charged. The support portion 22 for supporting the device being charged is disposed above the charging base 21. In some embodiments, as shown in FIG. 3 to FIG. 5, the wireless charger 20 is a vertical wireless charger, and the support portion 22 can be disposed above the charging base 21 in an inclined and upwardly extending manner, and when being charged, the device being charged can lean on the support portion 22 and be charged.

The charging coil 23 is disposed on the support portion 22, and used to charge the device being charged. The battery of the device being charged can be charged in a non-contact manner through the charging coil 23. When the device being charged is placed or leaned on the support portion 22, a charging position of the device being charged corresponds to the area of the charging coil 23, thereby forming a charging area.

The cross-flow fan 24 is disposed above the charging base 21, it has a fan air outlet 241 extending along a width direction of the support portion 22, and dissipates heat away from the device being charged and/or the wireless charger 20 through exhaust air. Herein, the width direction of the support portion 22 can be the width direction identified in FIG. 3, and a front side of the support portion 22 or a casing 221, which will be described below, refers to a side where the support portion 22 supports the device being charged, and a rear side refers to a side opposite to the front side, and a length direction of the support portion 22 is also shown accordingly in FIG. 3.

In the above embodiment, as shown in FIG. 7, the wind blown out from the fan air outlet 241 propagates in a straight line and can propagate over a longer distance through the cross-flow fan 24, and thus the entire charging area can be covered, thereby the heat dissipation effect is ensured. At the same time, the fan air outlet 241 of the cross-flow fan 24 extends along the width direction of the support portion 22, and the extended width thereof can exceed the width of the charging coil 23 to ensure that the wind blown out can cover the charging area.

In some embodiments, the cross-flow fan 24 can include: a fan housing 242 having a cylindrical shape, and disposed to extend along the width direction of the support portion 22; a fan air inlet 243 opened on an axial end face on one side or both sides of the fan housing 242, or opened on a radial peripheral surface of the fan housing 242, which enable the air inlet smoother; and a fan air outlet 241 disposed in a radial direction of the fan housing 242 and extending along an axial direction. The cross-flow fan 24 can further include shafts and blades, which are not shown in the figures, disposed inside the fan housing 242.

The cross-flow fan 24 rotates through the blades in the fan housing 242, takes in air from the fan air inlet 243 and exhausts the air through the fan air outlet 241 to generate the wind for heat dissipation. The cross-flow fan 24 can discharge the wind propagating linearly in the radial direction from the fan air outlet 241 and blow the wind in parallel to the charging area in the width direction of the support portion 22 to dissipate heat.

In some embodiments, the support portion 22 can include: a casing 221 in which the charging coil 23 and the cross-flow fan 24 can be disposed, and the cross-flow fan 24 is disposed under the charging coil 23; a first surface 2211 of the casing 221 is used to support the device being charged; and a casing air outlet 2212 is disposed on the first surface 2211 and extends along the width direction of the support portion 22, and the fan air outlet 241 of the cross-flow fan 24 is adjacent to an inner side of the casing air outlet 2212.

In the embodiments of the present disclosure, the casing 221 can be an integrative structure, or can be formed by combining multiple components, and in an example, as shown in FIG. 5, the casing 221 can include an upper casing 221a and a lower casing 221b. A cavity is formed inside the casing 221, and can accommodate the cross-flow fan 24 and the charging coil 23.

In the vertical wireless charger, the cross-flow fan 24 can be located at a lower position in the casing 221, and the fan air outlet 241 thereof can be disposed near the casing air outlet 2212 of the first surface 2211, or can be directly coupled to the casing air outlet 2212, thereby ensuring that the wind blown out from the cross-flow fan 24 can be blown out through the casing air outlet 2212. The charging coil 23 is located in the casing 221 and is located at a position above the cross-flow fan 24, which corresponds to a general charging position of the device being charged, the wind blown out from the fan air outlet 241 of the cross-flow fan 24 is blown out through the casing air outlet 2212 and then goes through the charging area corresponding to the charging coil 23 to dissipate heat and cool down the device being charged and the like.

In some embodiments, a side part and/or a rear part of the casing 221 are provided with a casing air inlet (not shown in the figures). The casing 221 can be provided with a casing air inlet at a corresponding position near the fan air inlet 243 of the cross-flow fan 24, the air can smoothly enter the housing 221 and smoothly enter the cross-flow fan 24 through the fan air inlet 243, such that the cross-flow fan 24 has a better blowing effect, thereby improving the heat dissipation effect.

In some embodiments, the first surface 2211 of the casing 221 includes: a support surface 22111, a charging surface 22112 and a stepped surface 22113. Herein, the support surface 22111 is located at a lower part of the first surface 2211 and is used to support a lower part of the device being charged. The support surface 22111 mainly serves to support the device being charged. The charging surface 22112 is located at an upper part of the first surface 2211, and the charging coil 23 is located at a rear side of the charging surface 22112, and when the device being charged is being charged, the charging area corresponds to an area located in the charging surface 22112. The stepped surface 22113 extends along the width direction of the support portion 22, the support surface 22111 and the charging surface 22112 are connected through the stepped surface 22113, and when the step surface 22113 makes the device being charged supported on the support surface 22111, there is a gap between the device being charged and the charging surface 22112.

A gap formed in the charging area can improve the heat dissipation effect, allow air to circulate, and enable the wind blown out by the fan to flow through the area thereby dissipating heat. Therefore, the first surface 2211 adopts the above result, the support surface 22111 at the lower part supports the device being charged, and the charging surface 22112 can be parallel to the support surface 22111 and slightly away from the device being charged as compared with the support surface 22111, thereby forming a gap. The height difference between the support surface 22111 and the charging surface 22112 forms the stepped surface 22113. The casing air outlet 2212 is disposed on the stepped surface 22113, such that the wind blown out by the cross-flow fan 24 can flow through the charging surface 22112 after being blown out through the casing air outlet 2212, thereby dissipating heat.

In some embodiments, the stepped surface 22113 includes: a middle section 22113a, a first side section 22113b and a second side section 22113c; the middle section 22113a is located at a middle part of the stepped surface 22113, and extends along the width direction of the support portion 22; and the first side section 22113b and the second side section 22113c are coupled to both ends of the middle section 22113a respectively, extend toward an upper part of the support portion 22, and connect to side surfaces of the casing 221.

As shown in FIG. 3, a middle part of the stepped surface 22113 is closer to the lower part of the support portion 22 than the side, since the casing air outlet 2212 is disposed on the stepped surface 22113, in this way, the wind blown out from the casing air outlet 2212 can be more concentrated under the action of the first side section 22113b and the second side section 22113c on both sides, such that more wind can blow through the charging area, and the wind can be propagated with heat faster after passing the charging area of the charging surface 22112 without the restriction of the first side section 22113b and the second side section 22113c, thereby improving the heat dissipation efficiency.

In some embodiments, openings can be provided on the middle section 22113a, the first side section 22113b and the second side section 22113c of the stepped surface 22113 to form the casing air outlet 2212.

In some other embodiments, an opening can be provided only on the middle section 22113a to form the casing air outlet 2212, such that the wind blown out is more concentrated, the first side section 22113b and the second side section 22113c play a role of wind gathering, and also enable the support surface 22111 to extend, on the side, toward the upper part of the support portion 22, and better support the device being charged.

In some embodiments, the charging coil 23 is disposed inside the casing 221 movably. In the present embodiment, the position of the charging coil 23 can be moved, such that it can adapt to different devices to be charged. At present, due to differences in the type and model of the devices to be charged, the charging position of each device being charged is not necessarily the same, and in order to improve charging efficiency, the position of the charging coil 23 can be moved to adjust, such that the charging coil 23 is aligned with the charging position of the device being charged.

Figure 11:
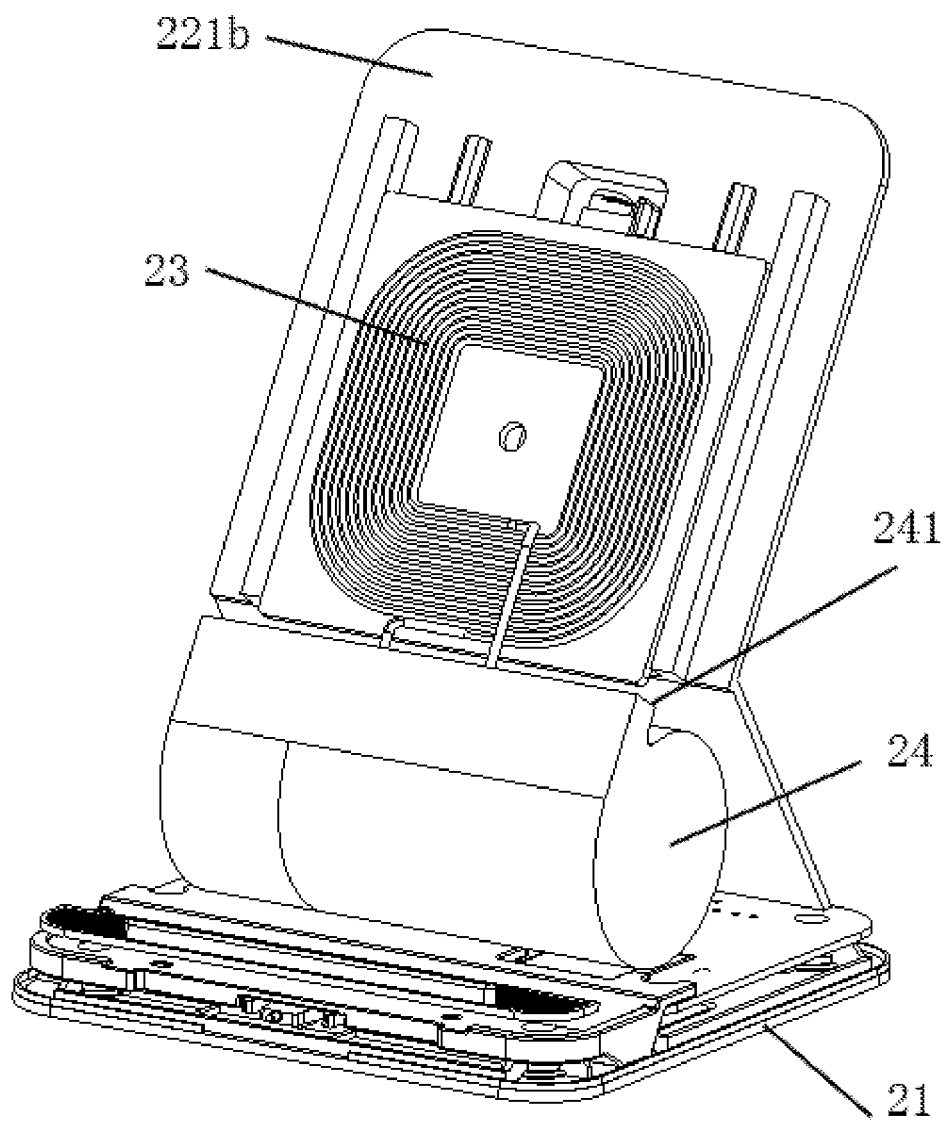
FIG. 11 is a partial schematic diagram of the wireless charger with a charging coil located at a first position.
Figure 12:
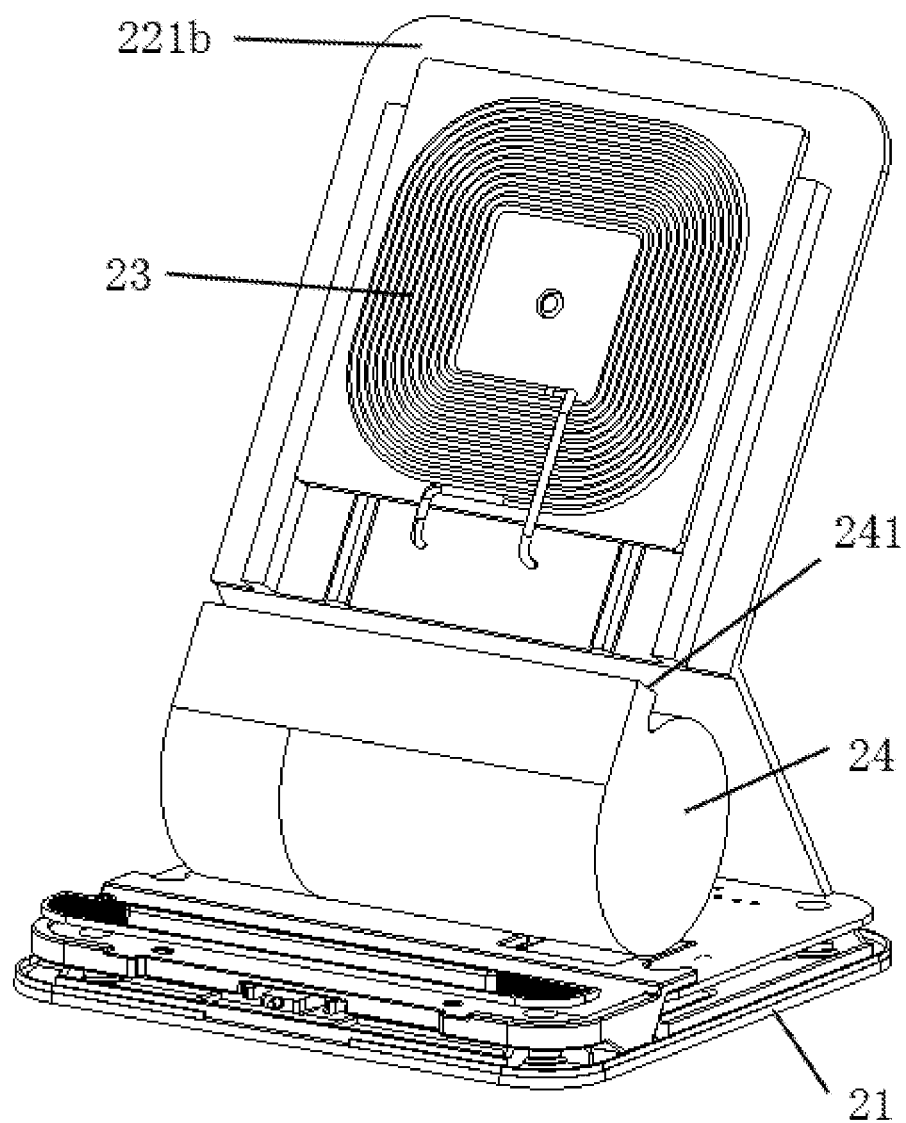
FIG. 12 is a partial schematic diagram of the wireless charger with a charging coil located at a second position.

As shown in FIG. 11 and FIG. 12, the charging coil 23 can be located at two different positions.

As shown in FIG. 11, the charging coil 23 is proximal to the lower part, and is adapted to the device being charged with a lower charging position.

As shown in FIG. 12, the charging coil 23 is proximal to the upper part, and is adapted to the device being charged with a higher charging position. In this case, it can be seen that the charging coil 23 is at a position farther away from the cross-flow fan 24, and in essence, this situation is that the charging position of the device being charged is higher and is farther from the cross-flow fan 24. In this case, the heat dissipation structure provided by the wireless charger 20 provided in the above embodiments of the present disclosure is even more necessary, the cross-flow fan 20 can make the blowing wind blow farther and cover the charging area. Even if the charging area is far away from the fan air outlet 241, the heat dissipation effect can be ensured.

In some embodiments, the wireless charger 20 further includes: a drive component disposed inside the casing 221, coupled to the charging coil 23, and used to drive the charging coil 23 to move along a length direction of the support portion 22 inside the casing 221. In these embodiments, the position of the charging coil 23 is adjusted by the drive component. The drive component can take a variety of forms, such as cylinders and the like.

Various embodiments of the present disclosure provide a configuration mode of the drive component, as shown in FIG. 5, the drive component can include a stepping motor module 251 and a guide rail 252. The stepping motor module 251 is coupled to the charging coil 23 and drives the charging coil 23 to move; and the guide rail 252 is disposed inside the casing 221 and cooperates with the charging coil 23, for example, the charging coil 23 can be provided correspondingly with a slider (not shown in the figures) cooperating with the guide rail 252, and the movement of the charging coil 23 is more stable through the guide rail 252.

The various device components, modules, units, blocks, parts, or portions may have modular configurations, or are composed of discrete components, but nonetheless can be referred to as "modules" in general. In other words, the "components," modules," "blocks," "parts," "portions," or "units" referred to herein may or may not be in modular forms, and these phrases may be interchangeably used.

The various embodiments of the present disclosure can have one or more of the following advantages.

By using the cross-flow fan, a size of the vertical wireless charger in a length direction can be reduced, and the wind propagates in a straight line and covers a larger size of the wireless charger in the width direction. As such, the heat dissipation effect can be improved, and the wind can propagate over a longer distance.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A wireless charger, configured to charge a device, the wireless charger comprising:
    a charging base disposed at a lower portion of the wireless charger;
    a support portion disposed over the charging base and configured to support the device being charged;
    a charging coil disposed in the support portion and configured to charge the device; and
    a cross-flow fan, located over the charging base, having a fan air outlet extending along a width direction of the support portion, and configured to dissipate heat away from at least one of the device being charged and the wireless charger through exhaust air.

2. The wireless charger according to claim 1, wherein the cross-flow fan comprises:
    a fan housing having a cylindrical shape, and disposed to extend along the width direction of the support portion;
    a fan air inlet opened on an axial end face on one side or both sides of the fan housing; and
    the fan air outlet disposed in a radial direction of the fan housing, and extending along an axial direction.

3. The wireless charger according to claim 1, wherein the support portion is disposed over the charging base in an inclined and upwardly extending manner.

4. The wireless charger according to claim 3, wherein the support portion comprises:
    a casing in which the charging coil and the cross-flow fan are disposed and the cross-flow fan being disposed under the charging coil, wherein a first surface of the casing is configured to support the device being charged; and
    a casing air outlet is disposed on the first surface and extending along the width direction of the support portion, and the fan air outlet of the cross-flow fan being adjacent to an inner side of the casing air outlet.

5. The wireless charger according to claim 4, wherein at least one of a side portion and a rear portion of the casing is provided with a casing air inlet.

6. The wireless charger according to claim 4, wherein the first surface comprises:
    a support surface located at a lower portion of the first surface, and configured to support a lower portion of the device being charged;
    a charging surface located at an upper portion of the first surface, and the charging coil being located at a rear side of the charging surface; and
    a stepped surface extending along the width direction of the support portion, the support surface and the charging surface being connected through the stepped surface, and there exists a gap between the device being charged and the charging surface, when the device being charged is supported on the support surface; and wherein the casing air outlet is disposed on the stepped surface.

7. The wireless charger according to claim 6, wherein the stepped surface comprises a middle section, a first side section and a second side section;
the middle section is located at a middle portion of the stepped surface, and extends along the width direction of the support portion; and
the first side section and the second side section are coupled to both ends of the middle section respectively, extend toward an upper portion of the support portion, and connect to side surfaces of the casing.

8. The wireless charger according to claim 7, wherein the casing air outlet is disposed in the middle section.

9. The wireless charger according to claim 4, wherein the charging coil is disposed inside the casing movably.

10. The wireless charger according to claim 9, wherein the wireless charger further comprises:
a drive component disposed inside the casing, coupled to the charging coil, and configured to drive the charging coil to move along a length direction of the support portion inside the casing.

11. The wireless charger according to claim 1, wherein the wireless charger is a vertical wireless charger.

12. The wireless charger according to claim 11, wherein a size of the vertical wireless charger in a length direction is reduced based on the cross-flow fan, such that wind propagates in a straight line and covers an increased area of the wireless charger in a width direction, thereby increasing heat dissipation and increasing a wind propagation distance.

13. An electronic apparatus set, comprising the wireless charger according to claim 1, and the device to be charged, wherein the device to be charged is a mobile phone.

14. The electronic apparatus set according to claim 13, wherein the support portion is disposed over the charging base in an inclined and upwardly extending manner.

15. The electronic apparatus set according to claim 14, wherein the support portion comprises:
a casing in which the charging coil and the cross-flow fan are disposed and the cross-flow fan being disposed under the charging coil, wherein a first surface of the casing is configured to support the device being charged; and
a casing air outlet is disposed on the first surface and extending along the width direction of the support portion, and the fan air outlet of the cross-flow fan being adjacent to an inner side of the casing air outlet.

16. The electronic apparatus set according to claim 15, wherein a side portion and a rear portion of the casing are provided with a casing air inlet.

17. The electronic apparatus set according to claim 16, wherein the first surface comprises:
a support surface located at a lower portion of the first surface, and configured to support a lower portion of the device being charged;
a charging surface located at an upper portion of the first surface, and the charging coil being located at a rear side of the charging surface; and
a stepped surface extending along the width direction of the support portion, the support surface and the charging surface being connected through the stepped surface, and a gap exists between the device being charged and the charging surface when the mobile phone being charged is supported on the support surface, to thereby improve the heat dissipation, allow air to circulate, and enable the wind blown out by the cross-flow fan to flow through the area to dissipate heat; and
wherein the casing air outlet is disposed on the stepped surface.

18. The electronic apparatus set according to claim 17, wherein the stepped surface comprises a middle section, a first side section and a second side section;
the middle section is located at a middle portion of the stepped surface, and extends along the width direction of the support portion; and
the first side section and the second side section are coupled to both ends of the middle section respectively, extend toward an upper portion of the support portion, and connect to side surfaces of the casing.

19. The electronic apparatus set according to claim 18, wherein the casing air outlet is disposed in the middle section, and the charging coil is disposed inside the casing movably, and configured to be driven by a drive component disposed inside the casing, to move along a length direction of the support portion inside the casing.

\* \* \* \* \*